(12) United States Patent
Hicken et al.

(10) Patent No.: US 8,555,141 B2
(45) Date of Patent: Oct. 8, 2013

(54) FLASH MEMORY ORGANIZATION

(75) Inventors: Michael Hicken, Rochester, MN (US);
Timothy Swatosh, Rochester, MN (US);
Martin Dell, Bethlehem, PA (US)

(73) Assignee: LSI Corporation, Milpitas, CA (US)

( * ) Notice: Subject to any disclaimer, the term of this patent is extended or adjusted under 35 U.S.C. 154(b) by 917 days.

(21) Appl. No.: 12/477,996

(22) Filed: Jun. 4, 2009

(65) Prior Publication Data

US 2010/0313097 A1 Dec. 9, 2010

(51) Int. Cl.
*G11C 29/00* (2006.01)

(52) U.S. Cl.
USPC .......................................... 714/763

(58) Field of Classification Search
USPC .......................................... 714/763
See application file for complete search history.

(56) References Cited

U.S. PATENT DOCUMENTS

| | | | |
|---|---|---|---|
| 4,389,715 A * | 6/1983 | Eaton et al. | 714/711 |
| 4,402,046 A | 8/1983 | Cox et al. | |
| 4,584,681 A * | 4/1986 | Singh et al. | 714/6.32 |
| 5,121,480 A | 6/1992 | Bonke et al. | |
| 5,297,029 A | 3/1994 | Nakai | |
| 5,353,410 A | 10/1994 | Macon et al. | |
| 5,732,409 A | 3/1998 | Ni | |
| 5,734,821 A | 3/1998 | Chung et al. | |
| 5,974,502 A | 10/1999 | DeKoning et al. | |
| 6,049,838 A | 4/2000 | Miller et al. | |
| 6,081,849 A | 6/2000 | Born et al. | |
| 6,145,072 A | 11/2000 | Shams et al. | |
| 6,158,004 A | 12/2000 | Mason et al. | |
| 6,212,617 B1 | 4/2001 | Hardwick | |
| 6,247,040 B1 | 6/2001 | Born et al. | |
| 6,324,594 B1 | 11/2001 | Ellis et al. | |
| 6,363,470 B1 | 3/2002 | Laurenti et al. | |
| 6,385,683 B1 | 5/2002 | DeKoning et al. | |
| 6,449,666 B2 | 9/2002 | Noeldner et al. | |
| 6,490,635 B1 | 12/2002 | Holmes | |
| 6,567,094 B1 | 5/2003 | Curry et al. | |
| 6,633,942 B1 | 10/2003 | Balasubramanian | |
| 6,678,785 B2 | 1/2004 | Lasser et al. | |
| 6,725,329 B1 | 4/2004 | Ng et al. | |
| 6,751,680 B2 | 6/2004 | Langerman et al. | |
| 7,069,559 B2 | 6/2006 | Janssen et al. | |
| 7,286,549 B2 | 10/2007 | Gaur | |
| 7,290,066 B2 | 10/2007 | Voorhees et al. | |
| 7,408,834 B2 | 8/2008 | Conley et al. | |

(Continued)

OTHER PUBLICATIONS

Andrew Birrell & Michael Isard, et al., A Design For High-Performance Flash Disks, ACM SIGOPS Operating Systems Review, vol. 41, Issue 2, pp. 88-93, (Apr. 2007).

(Continued)

*Primary Examiner* — Albert Decady
*Assistant Examiner* — Enam Ahmed

(57) ABSTRACT

A flash-memory system is organized into a plurality of blocks and a plurality of pages in each block, each page having $2^N$ data locations and K spare locations. At least one page in the memory has $2^M$ user data sectors and each sector has $2^{N-M}+L$ locations therein. Because L is at least 1 but less than $2^{N-M}$, user data is stored in the spare memory locations. By storing user data in spare locations that were previously off-limits to user data, enterprise-sized sectors can be efficiently stored in flash memories with little wasted memory, thereby making flash-memory systems compatible with existing hard-drive storage systems in enterprise system applications.

23 Claims, 3 Drawing Sheets

(56) References Cited

U.S. PATENT DOCUMENTS

| | | |
|---|---|---|
| 7,461,183 B2 | 12/2008 | Ellis et al. |
| 7,472,331 B2 | 12/2008 | Kim |
| 7,512,847 B2 | 3/2009 | Bychkov et al. |
| 7,590,803 B2 | 9/2009 | Wintergerst |
| 7,650,449 B2 | 1/2010 | Lu |
| 7,653,778 B2 | 1/2010 | Merry et al. |
| 7,925,847 B2 | 4/2011 | Ellis et al. |
| 2003/0051078 A1 | 3/2003 | Yoshitake |
| 2003/0110325 A1 | 6/2003 | Roach et al. |
| 2003/0167395 A1 | 9/2003 | Chang et al. |
| 2004/0044873 A1 | 3/2004 | Wong et al. |
| 2004/0177212 A1 | 9/2004 | Chang et al. |
| 2005/0114729 A1 | 5/2005 | Nielsen et al. |
| 2005/0144516 A1 | 6/2005 | Gonzalez et al. |
| 2005/0203988 A1 | 9/2005 | Nollet et al. |
| 2006/0050693 A1 | 3/2006 | Bury et al. |
| 2006/0095611 A1 | 5/2006 | Winchester et al. |
| 2006/0123259 A1 | 6/2006 | Yokota et al. |
| 2006/0155920 A1* | 7/2006 | Smith et al. .......... 711/103 |
| 2007/0028040 A1 | 2/2007 | Sinclair |
| 2007/0109856 A1 | 5/2007 | Pellicone et al. |
| 2007/0255889 A1 | 11/2007 | Yogev et al. |
| 2007/0266200 A1 | 11/2007 | Gorobets et al. |
| 2007/0300130 A1* | 12/2007 | Gorobets .......... 714/766 |
| 2008/0034153 A1 | 2/2008 | Lee et al. |
| 2008/0052446 A1 | 2/2008 | Lasser et al. |
| 2008/0082726 A1 | 4/2008 | Elhamias |
| 2008/0120456 A1 | 5/2008 | Lee et al. |
| 2008/0140916 A1 | 6/2008 | Oh et al. |
| 2008/0155145 A1 | 6/2008 | Stenfort |
| 2008/0162079 A1 | 7/2008 | Astigarraga et al. |
| 2008/0224924 A1 | 9/2008 | Lethbridge |
| 2008/0263307 A1 | 10/2008 | Adachi |
| 2008/0279205 A1 | 11/2008 | Sgouros et al. |
| 2009/0138663 A1 | 5/2009 | Lee et al. |
| 2009/0172308 A1 | 7/2009 | Prins et al. |
| 2009/0271562 A1 | 10/2009 | Sinclair |
| 2009/0271796 A1 | 10/2009 | Kojima |
| 2009/0282301 A1 | 11/2009 | Flynn et al. |
| 2009/0285228 A1 | 11/2009 | Bagepalli et al. |
| 2009/0287859 A1 | 11/2009 | Bond et al. |
| 2009/0300277 A1 | 12/2009 | Jeddeloh |
| 2009/0313444 A1 | 12/2009 | Nakamura |
| 2010/0011260 A1 | 1/2010 | Nagadomi et al. |
| 2010/0023800 A1 | 1/2010 | Harari et al. |
| 2010/0122148 A1 | 5/2010 | Flynn et al. |
| 2010/0269015 A1* | 10/2010 | Borchers et al. .......... 714/758 |
| 2010/0325317 A1 | 12/2010 | Kimelman et al. |
| 2011/0041039 A1 | 2/2011 | Harari et al. |
| 2011/0055458 A1 | 3/2011 | Kuehne |
| 2011/0093766 A1* | 4/2011 | Murray et al. .......... 714/773 |
| 2011/0099355 A1 | 4/2011 | Tran |

OTHER PUBLICATIONS

Sun et al.; On the Use of Strong BCH Codes for Improving Multilevel NAND Flash Memory Storage Capacity; ECSE Department., Rensselaer Polytechnic Institute, Aug. 2006; USA.

Kang et al.; A Superblock-based Flash Translation Layer for NAND Flash Memory: Computer Science Division; Korea Advanced Institute of Science and Technology (KAIST); EMSOFT '06 Seoul, Korea; pp. 161-170; Published by ACM, New York, NY, USA.

Micron Technolog, Inc.; NAND Flash 101: An Introduction to NAND Flash and How to Design it In to Your Next Product; TN-29-19; 2006; pp. 1-28; Micron Technology, Inc., Boise, Idaho, USA.

TCG Core Architecture Specification, Version 2.0, Trusted Computing Group, 2009 USA.

TCG Storage Interface Interactions Specification, Version 1.0, Trusted Computing Group, 2009 USA.

TCG Storage SSC: Enterprise, Version 1.0, Trusted Computing Group 2009 USA.

TCG Storage SSC: Opal, Version 1.0, Trusted Computing Group 2009 USA.

Specification for the Advanced Encryption Standard (AES), Federal Information Processing Standard (FIPS) Publication 197, 2001 USA.

Specification for the Secure Hash Standard (SHS), FIPS Publication 180-3 (2008), National Institute of Standards and Technology (NIST) USA.

\* cited by examiner

FLASH MEMORY ORGANIZATION

CROSS-REFERENCE TO RELATED APPLICATIONS

The subject matter of this application is related to copending U.S. patent application Ser. No. 12/478,013, filed concurrently with this application, having common inventors with this application, assigned to the same assignee as this application, and the teachings of which are incorporated herein in its entirety by reference. The subject matter of this application is also related to U.S. patent application Ser. Nos. 12/436,227 filed May 6, 2009, 12/475,710 filed Jun. 1, 2009, 12/475,716 filed Jun. 1, 2009, 12/478,013 filed Jun. 4, 2009, 12/508,879 filed Jul. 24, 2009, 12/508,915 filed Jul. 24, 2009, 12/643,471 filed Dec. 21, 2009, 12/649,490 filed Dec. 30, 2009, 12/722, 828 filed Mar. 12, 2010, 12/730,627 filed Mar. 24, 2010, 12/731,631 filed Mar. 25, 2010, 12/767,985 filed Apr. 27, 2010, 12/768,058 filed Apr. 27, 2010, 12/769,882 filed Apr. 29, 2010 and 12/769,910 filed Apr. 29, 2010.

TECHNICAL FIELD

The present invention relates to flash-memory generally, and, in particular, to flash-memory file system architectures or the like.

BACKGROUND

Disk-drive (or hard-drive) memory systems are being replaced with solid-state memory systems utilizing flash-memory technology. Compared to hard-drive systems, flash-memory systems offer the reliability of semiconductor-based memory along with less energy consumption and smaller size. While significant in-roads have been made in replacing hard-drives in consumer-based products such as in laptop computers, few of the hard-drives in enterprise-level systems have been replaced with solid-state drives for a variety of reasons. The most notable reason is the incompatibility of the file system structure in existing flash drive systems with the file system structure in enterprise-based hard-drives. This incompatibility is forced by the flash-memory architecture and by de facto hard-disk file structure system conventions.

Generally, flash-memory architecture requires the erasure of large blocks of memory but subsections, referred to as pages, may be written to as needed. Within each page, there are usually $2^N$ bytes of memory (N is an integer and, at present, N ranges from 10 to 14 or more) for storing user data and an additional 100 to 500 or more bytes of memory for storing redundancy data (ECC) and file system information (e.g., metadata). The ECC is for detecting and correcting data stored in the corresponding user data in the page and the file system information is used for mapping virtual to physical addresses and vice-versa. As such, the additional bytes of memory are "hidden" from the user and are not available for storing data.

For consumer applications, hard-drive systems have data sectors that are generally arranged with data sized in powers of two, e.g., $2^8$ or $2^{10}$ bytes per sector. This works well with flash memories having similarly structured user data memory pages. However, for enterprise-based systems, the sectors are not sized by powers of two but larger, e.g., 520 or 528 bytes instead of 512 bytes ($2^9$). At present, forcing these larger sectors into existing flash-memory architectures results in inefficient designs with many unused bytes in each page, at least partially negating the advantages of flash-memory systems over hard-drive systems.

SUMMARY

In one embodiment, the present invention is a flash-memory system having a plurality of blocks and a plurality of pages in each block, at least one page having $2^N$ data memory locations and K spare memory locations. At least one of the pages is adapted to have $2^M$ user data sectors for storing user data, each data sector having $2^{N-M}+L$ memory locations therein, where M, N, L, and K are positive integers, N>M, M≥1, and $1 \leq L < 2^{N-M}$.

In another embodiment, the present invention comprises a method of retaining user data in a memory system, the method comprising: providing a flash-memory system organized into a plurality of blocks and a plurality of pages in each block, at least one of the pages having $2^N$ data locations and K spare locations, the at least one page having $2^M$ user data sectors therein, each sector having $2^{N-M}+L$ locations therein, where M, N, L, and K are positive integers, N>M, M≥1, $1 \leq L < 2^{N-M}$; and storing user data in at least one of the $2^M$ user data sectors.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements.

DETAILED DESCRIPTION

Acronyms and Definitions

Application Programming Interface (API): protocol or format used by an application to communicate with a different application.

Block: the number of memory locations that are erased at one time in a flash-memory.

ECC data: error correction code information. This is redundancy information relating to data written to the memory used to detect and, if possible, correct data read from the memory.

Inter-Processor Communications (IPC): communications protocol for communications between processors or systems.

Page: the minimum number of memory locations that are read or written at a time within a block.

Sector: the number of bytes that are grouped together within a page. There are multiple sectors in each page.

Exemplary Embodiments of the Invention

For purposes of this description and unless explicitly stated otherwise, each numerical value and range should be interpreted as being approximate as if the word "about" or "approximately" preceded the value of the value or range. Further, signals and corresponding nodes, ports, inputs, or outputs may be referred to by the same name and are interchangeable.

Additionally, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the terms "implementation" and "example."

Also for purposes of this description, the terms "couple," "coupling," "coupled," "connect," "connecting," or "connected," refer to any manner known in the art or later developed in which a signal is allowed to be transferred between two or more elements and the interposition of one or more additional elements is contemplated, although not required. Conversely, the terms "directly coupled," "directly connected," etc., imply the absence of such additional elements.

Figure 1:
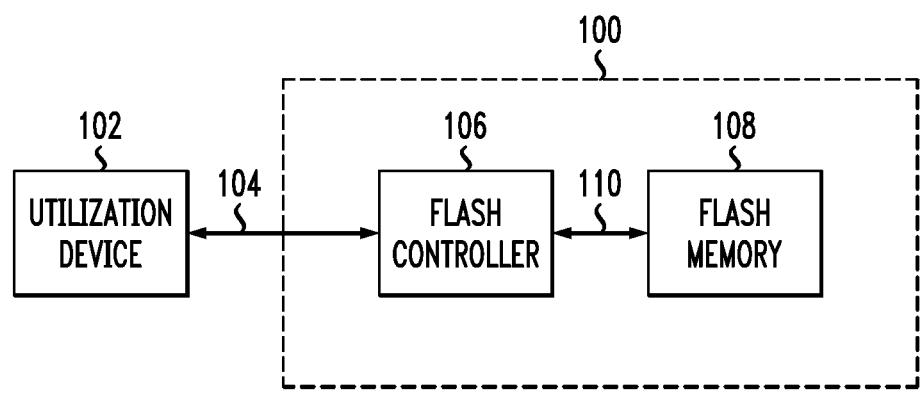
FIG. 1 is a simplified diagram of an exemplary flash-memory system.

In FIG. 1, a simplified exemplary flash-memory storage system 100 is diagrammed. Here, the memory system 100 communicates with a utilization device 102, such as a computer system, via communication link 104. The communication link 104 may be one of a variety of standard communication interface standards and protocols, such as SAS/SCSI (serial attached storage/small computer system interface), SATA (serial advanced technology attachment), USB (universal serial bus), IEEE 802.11, IEEE 802.1, etc., or a custom interface, as desired. Inside of the storage system 100 is a flash controller 106 and flash-memory array 108 in communication with the controller 106 by a conventional communications path 110. As will be explained in more detail below, the flash controller 106 controls the writing and reading of data from the utilization device 102 and the memory 108. For purposes here, the flash controller 106 has one or more processors (not shown) therein along with the software/firmware as needed for operation.

As is well known in the art, the flash-memory may be composed of a single chip or multiple chips. Operation of the flash-memory 108 (e.g., erase, write, and read operations) is well known; see, for example, "NAND Flash 101: An Introduction to NAND Flash and How to Design it into Your Next Product" by Micron Technology, Inc., TN-29-19, July, 2004, incorporated herein by reference in its entirety. Each memory chip is physically organized into blocks and typical memories have blocks of one megabyte or more. The blocks are in turn subdivided into pages, and each page further subdivided into sectors. Thus, and as will be discussed in more detail below, a file system utilizing a flash-memory writes data into a block on a page-by-page basis, each page having multiple sectors therein. Similarly, when reading data from the memory, a page at a time is read and all the sectors within the page are read. Data is organized into sectors to retain compatibility with hard-disk file systems.

Existing flash memories typically have a power of two pages per block (e.g., $2^8$, $2^{10}$, etc.); each page has power of two memory locations (e.g., $2^{12}$ memory locations, each location storing a byte) allocated for data storage and a spare set of memory locations available for reading and writing along with the other bytes in the page (e.g., 128, 218, 224 bytes for a $2^{12}$ byte page, and 376 or 520 bytes for a $2^{13}$ byte page). The spare set of memory locations has heretofore been reserved for storing ECC data segments and other metadata (used by the FTL process, described below) for the data stored in the memory locations of the page. In a typical consumer flash-memory system, such as in an MP3 player, each page has multiple sectors, each sector having $2^9$ memory locations (512 bytes). This results in the page storing eight sectors ($2^{12}/2^9=8$), along with the spare memory locations containing the necessary ECC data and metadata related to the sectors in the page. However, hard-disk enterprise (non-consumer) systems have 520 or 528 bytes in each sector and attempting to store eight of these larger sectors in a page will exceed the number of memory locations allocated for data storage.

Figure 2:
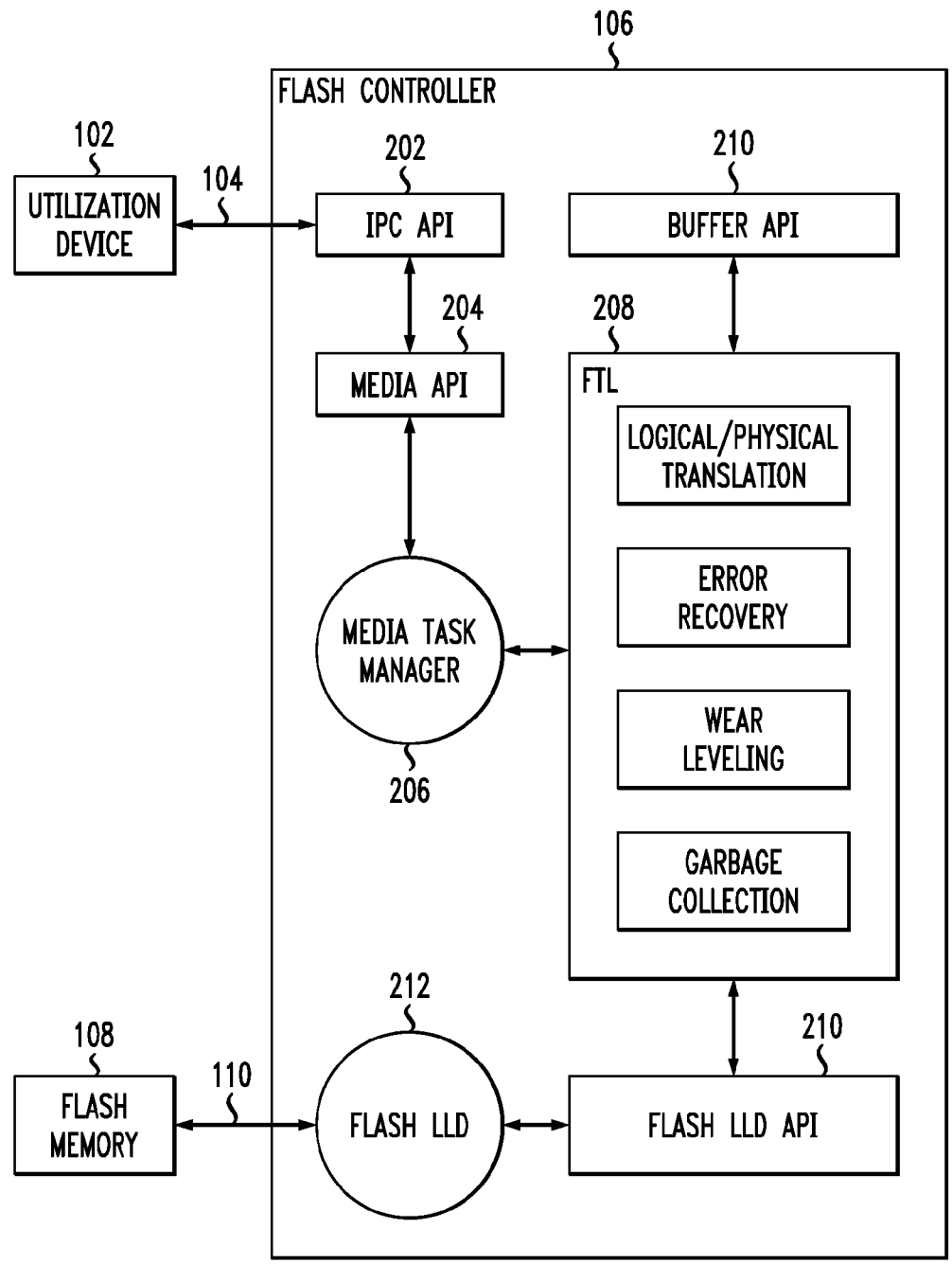
FIG. 2 is a logical diagram of exemplary functional portions of the flash-memory system of FIG. 1.

FIG. 2 illustrates the functionality of the flash controller 106 using a logical or functional diagram of various software/firmware processes implemented within the controller 106; it is understood that other organizations of the functional elements in the controller 106 are possible, as well as adding processes or moving the processes to other processors, such as into the utilization device 102. In this example and as is well known in the art, conventional IPC API 202 and media API 204 implements the protocol required to operate the communications link 104 (e.g., utilizing parallel data and address buses) and to control the flow of data between the utilization device 102 and the controller 106, as described above. The media task manager process 206 processes data access commands from the utilization device and communicates with the FTL (flash translation layer) process 208 to provide the desired functionality of flash-memory system 100 (FIG. 1). The FTL process 208, as will be explained in more detail below, makes the flash-memory system 100 (FIG. 1) appear to the utilization device as a block-oriented device, similar to a hard disk drive. The FTL 208 uses a conventional buffer via buffer API 210 to temporarily store and retrieve data as needed. The FTL process 208 interfaces with the flash-memory 108 via a flash-memory low-level driver (LLD) API 210 and a conventional flash-memory LLD 212. The LLD 212 separates the low-level hardware-specific signal and timing requirements of the flash-memory circuitry from the functionality of the FTL process by implementing the hardware-specific basic read and write operations of the memory 108.

As is well understood in the art, the FTL 208 translates the logical-to-physical addresses (and vice-versa) of data stored in the memory 108 by using, for example, the metadata stored in the flash-memory page being accessed. Further, the FTL 208 provides "garbage collection" (the identification of unused flash-memory pages for reuse), error recovery (adding redundancy information to data stored in the memory 108 and correcting erroneous data read from the memory), and wear leveling (spreading the erasing and writing of blocks of memory cells over the entire flash-memory to avoid repeatedly erasing and writing a subset of the memory blocks, thereby making the flash-memory last longer than would otherwise occur). Details on how an FTL operates and is organized are described in "A Superblock-based Flash Translation Layer for NAND Flash-memory" by Kang et al., presented at EMSOFT '06, 22-25 Oct. 2006 in Seoul, Korea, included herein by reference in its entirety.

Figure 3:
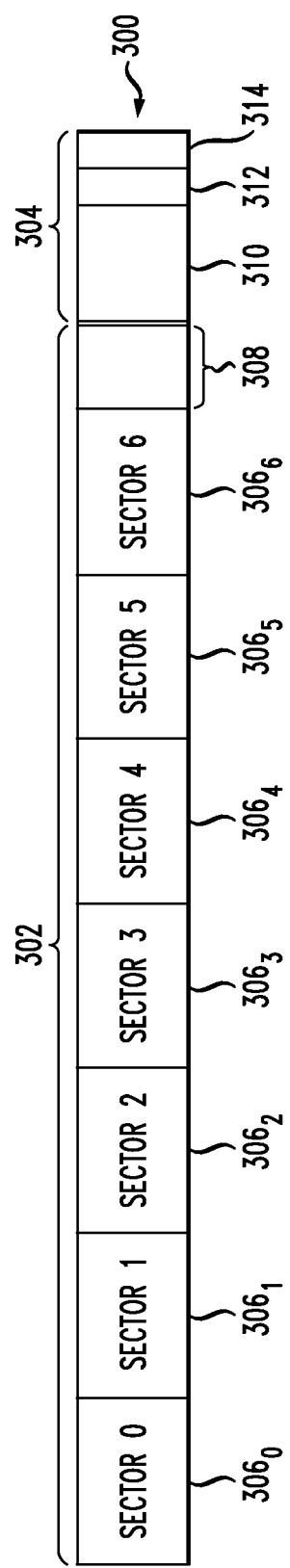
FIG. 3 is a simplified diagram of a file system structure for the flash-memory system of FIGS. 1 and 2, according to one embodiment of the invention.

In accordance with one embodiment of the invention, FIG. 3 illustrates a new organization of the pages in a memory file system permitting the efficient storing of enterprise-sized sectors in a page. Here, an exemplary page 300 in a flash-memory block (not shown) has therein two portions, the conventional data storage portion 302 having $2^N$ (N=12 in this example) memory locations, and the "spare" area 304 having several-hundred memory locations. In this example, $2^M$ (here M=3) conventional enterprise-sized sectors $306_0$-$306_7$ (here $2^{N-M}+L$ bytes per sector, where $1 \leq L < 2^{N-M}$; for a 520 or 528 bytes sector in this example, L=8 ($2^3$) or 16 ($2^4$), respectively) are shown filling the portion 302 and excess 308 of sector $306_7$ (the part of sector $306_7$ not fitting within the boundary of portion 302) being stored in the spare area 304. Further, ECC data segments 310 (shown here as one ECC data segment), related to the corresponding sectors $306_0$-$306_7$, are stored in the spare area 304, along with metadata 312 (if any). The metadata 312 may have its own ECC (not shown) to protect the metadata from corruption, or the ECC data 310 may also cover the metadata 312, as desired. The remainder 314 of the spare area 304 may be unused or allocated for additional metadata or ECC data as required. Alternatively, for example where N=13, L can be larger (e.g., $2^3$, $2^4$ or $2^5$) with a correspondingly larger sector size or more sectors to the page.

Figure 4:
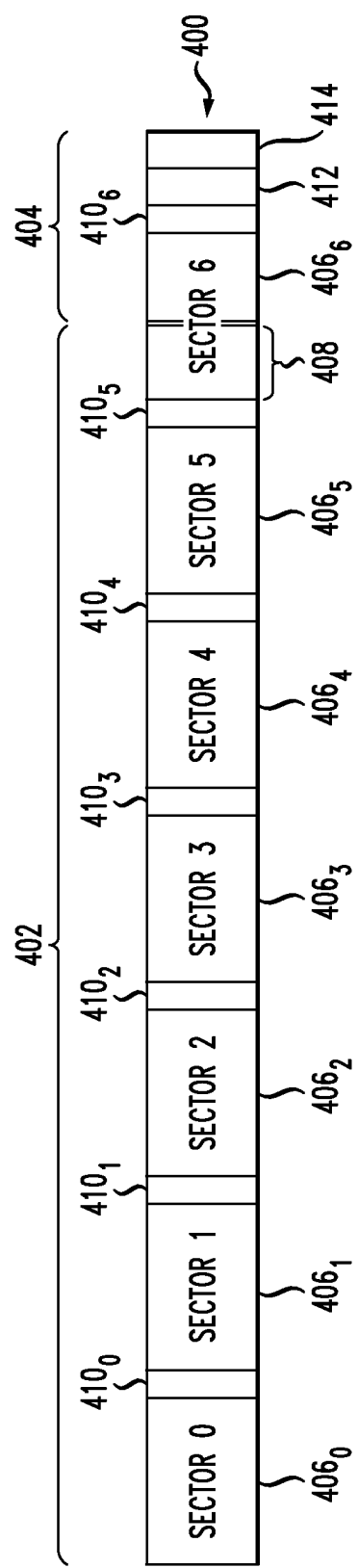
FIG. 4 is a simplified diagram of an alternative file system structure for the flash-memory system of FIGS. 1 and 2, according to another embodiment of the invention.

In accordance with another embodiment of the invention, FIG. 4 illustrates another new organization of the pages in a memory file system permitting the efficient storing of enterprise-sized sectors in a page. Because the page organization in FIG. 4 is similar to the page organization of FIG. 3, the elements in FIG. 4 that are similar to corresponding elements in FIG. 3 will be referred to using the nomenclature 4XX, where XX refers to the corresponding element in FIG. 3. Here, the eight conventional enterprise-sized sectors $406_0$-$406_7$ are shown filling the portion 402 and excess 408 of sector $406_7$ (the part of sector $406_7$ not fitting within the boundary of portion 302) being stored in the spare area 404. However, distinct from the page organization of FIG. 3, the ECC data segments $410_0$-$410_7$ are related to and stored adjacent to the corresponding sectors $406_0$-$406_7$. The metadata 412 may remain in the spare area 404 (along with ECC data (not shown) used to protect the metadata 412) and the remainder 414 of the spare area 404 may be unused or allocated for additional metadata or ECC data as required. Alternatively, the metadata 412 is divided up and placed into the ECC data segments $410_0$-$410_7$, and the metadata protected by the corresponding ECC data segment.

Advantageously, by using the spare area (304, 404) that was previously off-limits to user data, enterprise-sized sectors can be efficiently stored in flash memories with little wasted memory, thereby making flash-memory systems compatible with existing hard-drive storage systems in enterprise system applications.

It is understood that the FTL process 208 (FIG. 2) is configured (programmed) to implement the new page structures of FIGS. 3 and 4; changes to the FTL process 208 are conventional given the teachings of the file system structure described above.

It is further understood that various changes in the details, materials, and arrangements of the parts and processes which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A flash-memory system comprising:
a plurality of blocks and a plurality of pages in each block, at least one page having 2N data memory locations and K spare memory locations;
wherein the at least one page is configured to have 2M user data sectors for storing user data, each data sector having 2N−M+L memory locations therein,
wherein error-correction code (ECC) data segments are related to and stored adjacent to the corresponding data sectors,
wherein metadata is divided up and placed into the ECC data segments,
wherein the spare memory locations include a remainder segment configured to be allocated to store additional ECC data or metadata,
wherein M, N, L, and K are positive integers, N>M, M≥1, and 1≤L<2N−M.

2. The apparatus of claim 1, wherein the memory system is further configured to store at least a portion of at least one user data sector in at least one of the spare memory locations.

3. The apparatus of claim 1, wherein the memory system is further configured to store at least one error-correction code (ECC) data segment, related to a corresponding one of the 2M user data sectors, in at least the spare memory locations.

4. The apparatus of claim 1, wherein the memory system is further configured to store at least one error-correction code (ECC) data segment, related to a corresponding one of the 2M user data sectors, in at least one of the data memory locations adjacent the corresponding user data sector.

5. The apparatus of claim 1, wherein $2^M(2^{N-M}+L) \leq 2N+K$, $L=2^P$, where P is a positive integer.

6. The apparatus of claim 5, wherein the memory is arranged in bytes, M=3, N=12, and P=3 or 4, and K=224.

7. The apparatus of claim 5, wherein the memory is arranged in bytes, M=4, N=13, P=3, 4, or 5, and K=520.

8. The apparatus of claim 5, wherein the memory system is further configured to store error-correction code (ECC) data configured into 2M ECC segments, each ECC segment related to a corresponding one of the 2M user data sectors.

9. The apparatus of claim 8, wherein the ECC segments are stored in at least the spare memory locations.

10. The apparatus of claim 8, wherein each of the ECC segments is stored adjacent to the corresponding data sector.

11. The apparatus of claim 10, wherein each of the ECC segments additionally stores metadata.

12. A method of retaining user data in a memory system, the method comprising:
providing a flash-memory system organized into a plurality of blocks and a plurality of pages in each block, at least one of the pages having $2^N$ data locations and K spare locations, the at least one page having $2^M$ user data sectors therein, each sector having $2^{N-M}+L$ locations therein, where M, N, L, and K are positive integers, N>M, M≥1, 1≤L<$2^{N-M}$; and
storing user data in at least one of the $2^M$ user data sectors;
storing error-correction code (ECC) data segments adjacent to the corresponding data sectors;
dividing metadata;
placing the divided metadata into the ECC data segments; and
allocating a remainder segment of the spare memory locations to store additional ECC data or metadata.

13. The method of claim 12, wherein at least a portion of a user data sector is capable of being stored in at least one of the spare memory locations.

14. The method of claim 12, further comprising the steps of:
calculating an error-correction code (ECC) data segment for at least one of the $2^M$ user data sectors; and
storing the ECC data segment in at least the spare locations.

15. The method of claim 14, further comprising the steps of:
- reading user data in a user data sector in at least one of the pages;
- reading the ECC data segment corresponding to the read user data sector; and
- checking and, if required, correcting the read user data using the read ECC data segment.

16. The method of claim 12, further comprising the step of:
- Calculating a error-correction code (ECC) data segment for each of the $2^M$ user data sectors in the at least one page and storing the ECC data segment adjacent the corresponding user data sector.

17. The method of claim 16, wherein each of the ECC data segments additionally stores metadata.

18. The method of claim 16, further comprising the steps of:
- reading user data in a user data sector in at least one of the pages;
- reading the ECC data segment corresponding to the read user data sector; and
- checking and, if required, correcting the read user data using the read ECC data segment.

19. The method of claim 12, wherein $L=2^P$, P is a positive integer.

20. The method of claim 19, wherein the memory is arranged in bytes, M=3, N=12, P=3 or 4, and K=224.

21. The method of claim 19, wherein the memory is arranged in bytes, M=4, N=13, P=3, 4 or 5, and K=520.

22. A method comprising:
- providing a flash-memory system having a plurality of pages, at least one of the pages having $2^N$ data locations and K spare locations;
- storing user data in at least one of $2^M$ user data sectors in the at least one page, each of the sectors having $2^{N-M}+L$ locations therein;
- calculating a error correction code (ECC) data segment for at least one of the user data sectors and storing the ECC data segment adjacent the corresponding user data sector;
- reading user data in a user data sector in at least one of the pages;
- reading the ECC data segment corresponding to the read user data sector;
- checking and, if required, correcting the read user data using the read ECC data segment;
- wherein M, N, L, and K are positive integers, N>M, M≥1, $1 \leq L < 2^{N-M}$ and wherein at least a portion of the at least one user data sector is stored in at least one of the spare locations in the at least one page;
- storing error-correction code (ECC) data segments adjacent to the corresponding data sectors;
- dividing metadata;
- placing the divided metadata into the ECC data segments; and
- allocating a remainder segment of the spare memory locations to store additional ECC data or metadata.

23. The method of claim 22, wherein the memory system is arranged in bytes, N=12, M=3, $L=2^P$, P=3 or 4, and K=224.

* * * * *